United States Patent [19]

Gross

[11] 4,415,868
[45] Nov. 15, 1983

[54] ONE AND ONE HALF POLE AUDIO POWER AMPLIFIER FREQUENCY COMPENSATION

[75] Inventor: William H. Gross, Tokyo, Japan

[73] Assignee: National Semiconductor Corporation, Santa Clara, Calif.

[21] Appl. No.: 287,386

[22] Filed: Jul. 27, 1981

[51] Int. Cl.³ .......................... H03F 1/34; H03F 3/183
[52] U.S. Cl. ..................................... 330/294; 330/107
[58] Field of Search ............... 336/107, 109, 294, 302, 336/303, 306, 307, 278; 325/315, 317

[56] References Cited

U.S. PATENT DOCUMENTS 4,205,276  5/1980  Wright et al. ...................... 330/294

Primary Examiner—James B. Mullins
Assistant Examiner—Gene Wan
Attorney, Agent, or Firm—Gail W. Woodward; Paul J. Winters; Michael J. Pollock

[57] ABSTRACT

In an integrated circuit audio power amplifier a 6 db per octave frequency-gain roll off is obtained in a conventional manner by converting a high gain inverter to an integrator and driving the integrator from a current source. A second cascaded stage is also provided so that it operates at lower gain and has a matching high frequency roll off. When such characteristics are combined in cascade the result is a 12 db per octave roll off at the higher frequencies. A flat negative feedback loop is employed to maintain a controlled constant low frequency gain. In the response region located between the 12 db per octave slope region and the constant gain region there is a 6 db per octave slope. The configuration is stable without resorting to frequency sensitive feedback. When such an amplifier is constructed to have its gain versus frequency roll off to unity at the low frequency end of the AM radio broadcast band, the amplifier will emit very little energy in the radio band, yet a sufficient audio bandwidth is available for Hi Fi response.

5 Claims, 3 Drawing Figures

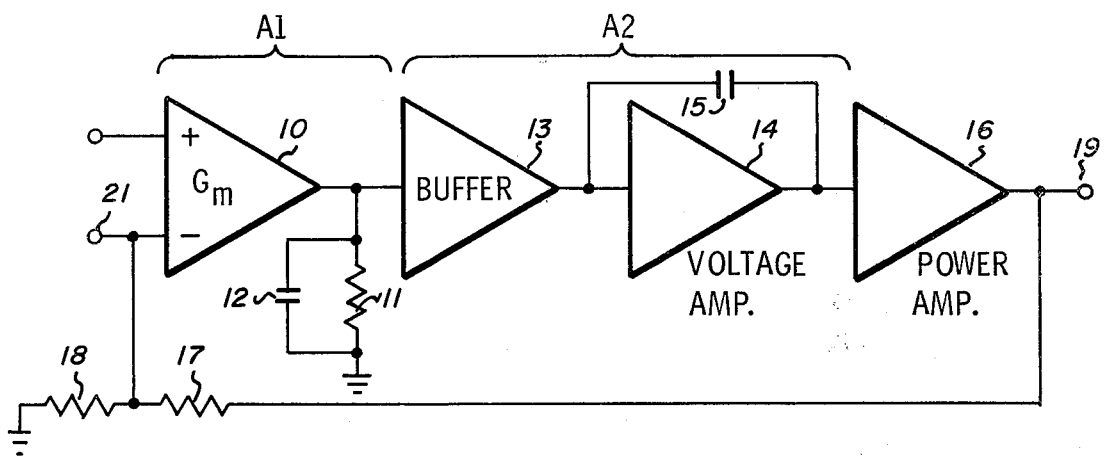
Fig_1
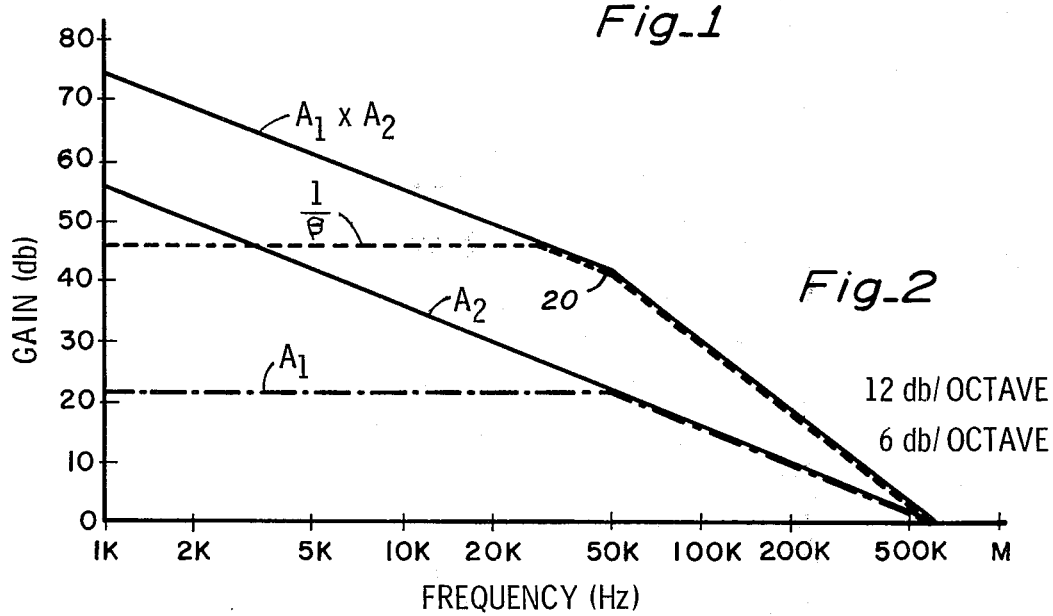
Fig_2
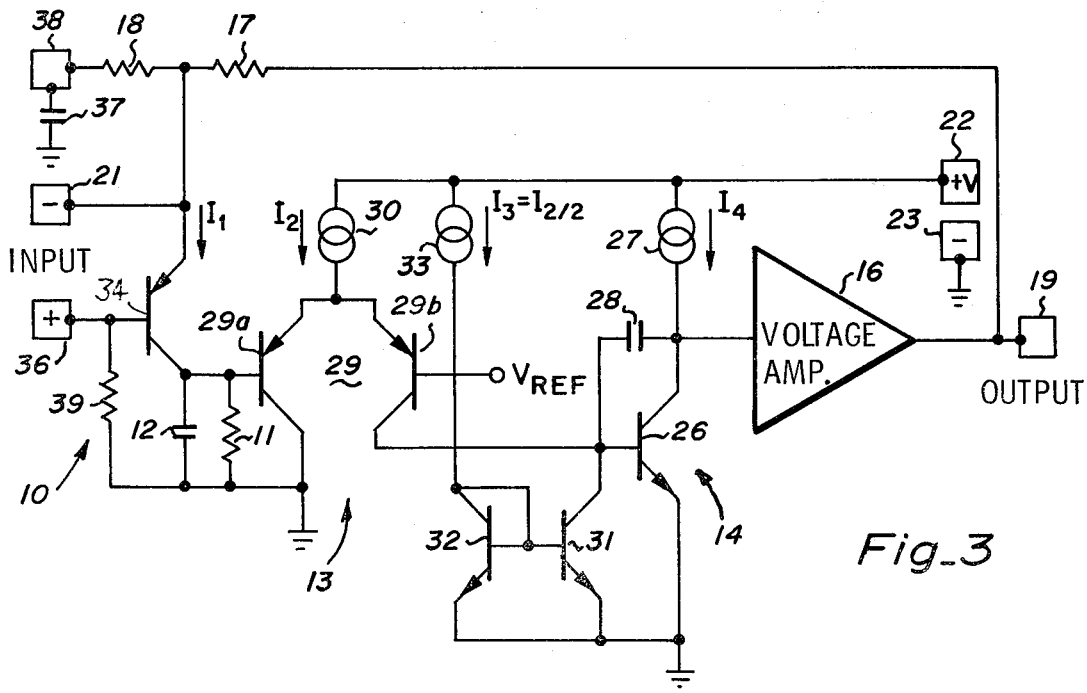
Fig_3

ONE AND ONE HALF POLE AUDIO POWER AMPLIFIER FREQUENCY COMPENSATION

BACKGROUND OF THE INVENTION

In my prior U.S. Pat. No. 4,205,276, which was obtained jointly with John W. Wright and assigned to the assignee of the present invention, an amplifier is disclosed having a 12 db per octave roll off. The teaching in that patent is incorporated herein by reference. The object of the steep roll off is to obtain substantial gain at the higher audio frequencies, sufficient for Hi Fi performance, and yet produce substantially zero output in the AM radio broadcast band. The circuit disclosed employed a two-pole filter concept with each filter introducing a 6 db roll off. It was found that such a steep roll off resulted in instabilities and a frequency selective feedback loop was incorporated for stabilization.

By employing a very steep roll off the amplifier output signals in the AM radio broadcast band are substantially eliminated. This means that in a very small radio, such as would be available in an integrated circuit (IC) version, the Hi Fi audio amplifier will not introduce spurious output signals that the radio can respond to in the form of noise or interference.

SUMMARY OF THE INVENTION

It is an object of the invention to compensate an audio amplifier so that it has a very steep gain versus frequency response region with a unity gain at the low end of the AM radio broadcast band and a region of lesser steepness intermediate to a flat response produced by a nonfrequency selective feedback network.

It is a further object of the invention to produce a two-pole amplifier frequency versus gain response at the high audio frequencies, a flat low frequency response and a one pole response in an intermediate region.

These and other objects are achieved in the following manner. In the amplifier circuit a current source is used to drive an active integrator, thereby producing a 6 db per octave roll off in gain. The combination is designed to have a large open loop gain and a unity gain point at the low end of the AM radio broadcast band. A cascaded stage is provided with a second pole wherein an RC integrator is cascaded with an amplifier that has substantially lower gain than the active integrator-driver combination. Thus, this stage has a flat gain versus frequency response and a 6 db per octave high frequency roll off. If both poles are located so as to produce unity gain at the same frequency, or close to it, the curve slope at this point is 12 db per octave. When the two gain versus frequency curves are combined, the result is an overall dual slope. At the lower frequencies the slope is 6 db per octave, while at the higher frequencies it is 12 db. If the overall amplifier feedback is adjusted so that the flat frequency-gain portion of the curve intersects the 6 db per octave slope, the requirements for stable negative feedback are met. I have discovered that the amplifier is unexpectedly stable. This amplifier does not require frequency selective feedback for stability.

I refer to the system as a one and one-half pole system because it operates as a one pole system at a frequency that is below the knee of the curve and as a two pole system at frequencies above the knee. Thus, it is not entirely either a one pole or a two pole system.

BRIEF DESCRIPTION OF THE DRAWING

FIG. 1 is a block diagram showing the elements of the invention.

FIG. 2 is a graph showing the frequency versus gain curves associated with FIG. 1.

FIG. 3 is a schematic diagram of an integrated circuit suitable for use with the invention.

DESCRIPTON OF THE INVENTION

FIG. 1 is a block diagram of an IC employing the invention. Differential input stage 10, which has gain A1, drives a low pass filter made up of resistor 11 and capacitor 12. Buffer amplifier 13 drives integrator 14. The combination has gain A2 and buffer 13 isolates capacitor 12 from integrator 14. However, because of capacitor 15, integrator 14, which is basically a high gain inverter with capacitive feedback, presents a capacitive load to buffer 13. This combination produces a conventional 6 db per octave response roll off as is well known in the IC art.

A nonfrequency sensitive feedback loop is obtained by means of resistors 17 and 18 which are coupled as an attenuator between output terminal 19 and inverting input terminal 21. For an overall gain of 46 db the attenuator should have an attenuation ratio, or Beta, of about 1/200.

FIG. 2 is a graph that shows the response curves associated with FIG. 1. The curve labeled A1 is the frequency response of stage 10 in combination with resistor 11 and capacitor 12. Basically, A1 is a gain of 22 db with a high frequency roll off of 6 db per octave to a unity gain at about 630 kHz. The curve labeled A2 is the gain response of buffer 13 times integrator 14 gain. This curve too has a 6 db per octave roll off to unity gain at about 630 kHz. However, since the inverter associated with the integrator has very high gain, A2 will continue to rise at lower frequencies. It is to be understood that while both curves go to unity gain at the same frequency, and this is the preferred condition, this is not an absolute requirement. It is only necessary that the unity gain points be reasonably close together. The curve A1×A2 shows the effect of cascading the two gain sections of FIG. 1. The resulting curve goes to unity at about 630 kHz and has a 12 db per octave slope down to that frequency where A1 breaks away. Thus, at lower frequencies, A1×A2 has a 6 db per octave slope. The line labeled 1/β represents the reciprocal of the negative feedback loop as set by resistors 17 and 18. With a feedback ratio of 1/200 (−46 db), the amplifier will produce the 46 db response of the heavy curve.

I have discovered that if the 1/β curve is made to intersect the A1×A3 curve at a frequency below the upper break point frequency, point 20 on the curve, the amplifier will be stable. This eliminates the necessity of frequency selective negative feedback. Since the feedback loop is entirely on the IC chip, the IC amplifier is itself stable and requires fewer off chip parts.

FIG. 3 is a schematic diagram of a circuit suitable for practicing the invention. An operating power supply is coupled between the +V terminal 22 and ground terminal 23. The output stage is a conventional power amplifier 16 which is shown as a block. Amplifier 16 has an output 19 that is intended to operate a speaker or some other transducer.

Transistor 26, which operates at collector current $I_4$ from current source 27, is a high gain inverting amplifier driving amplifier 16. Capacitor 28 is coupled from output to input, thereby converting transistor 26 into an active integrator.

The integrator is driven from a signal current supply in the form of a differential amplifier (diff-amp) 29 buffer. Current source 30 supplies $I_2$ as tail current. Transistor 31 acts as a current source load for transistor 29b and is part of a current mirror that includes diode connected transistor 32. $I_3$ flowing in source 33 is made equal to $I_2/2$ so that diff-amp 29 is balanced. The base of transistor 29b is returned to a 0.3 volt reference. This diff-amp 29 biasing sets its internal resistance to operate with active integrator 26 so that no separate resistor is required.

Transistor 34 is driven differentially from inverting input terminal 21 and noninverting input terminal 36. Resistor 17 provides a d-c return for $I_1$ to the emitter of transistor 34 from the output terminal 19 which is nominally at $+V/2$. Resistor 18 is bypassed to ground by d-c blocking capacitor 37, which allows resistors 17 and 18 to act as an a-c feedback signal attenuator as well as a biasing current return. Since capacitor 37 is relatively large, it is connected off chip by means of pad 38. The base of transistor 34 is returned to ground through resistor 39. Resistor 11 and capacitor 12, whose function was related to FIG. 1, are present to provide the d-c return to ground for the base of transistor 29a and the pole required for A1 of FIGS. 1 and 2.

Example

The ciurcuit of FIG. 3 was constructed in the form of a standard silicon monolithic IC. The NPN transistors were of conventional vertical construction and had current gain values in excess of 200. The PNP transistors were conventional lateral high current gain devices. The following component values were used.

| COMPONENT | VALUE | UNITS |
| --- | --- | --- |
| Resistor 11 | 23K | ohms |
| Capacitor 12 | 130 | p farads |
| Resistor 17 | 17K | ohms |
| Resistor 18 | 85 | ohms |
| Capacitor 28 | 10 | p farads |
| Current Source 27 | 50 | μ amperes |
| Current Source 30 | 4 | μ amperes |
| Current Source 33 | 2 | μ amperes |
| Capacitor 37 | 10 | μ farads |
| Resistor 39 | 24K | ohms |

The circuit had a response curve close to the one shown in FIG. 2. Unity gain occurred at about 630 kHz and the overall gain was 46 db. The audio bandwidth was about 40 kHz. The circuit was stable and did not need any frequency sensitive negative feedback.

The invention has been described and an operating example detailed. There are alternatives and equivalents, within the spirit and intent of the invention, that will occur to a person skilled in the art upon reading the foregoing. Accordingly, it is intended that the scope of the invention be limited only by the following claims.

I claim:

1. An operational amplifier for providing substantial gain of audio frequencies and having very low response at frequencies within the AM standard radio broadcast band, said amplifier comprising:
   first amplifying means having a gain characteristic in which the response is flat at low frequencies and rolls off at a 6 db per octave to a unity gain value at a frequency in the vicinity of the low end of said AM standard radio broadcast band;
   second amplifying means having a gain characteristic higher than that of said first amplifying means and a gain characteristic in which the response falls off at a 6 db per octave rate within said audio frequencies to a unity gain value near the same frequency as said first amplifying means;
   means for coupling said first and said second amplifying means in a cascaded configuration; and
   gain controlling negative feedback means around both said first and said second amplifying means for determining the overall amplifier gain at a level above that of said first amplifying means.

2. The amplifier of claim 1 wherein said second amplifying means comprise an active integrator in combination with a pole locating resistance.

3. The amplifier of claim 2 wherein said cascaded configuration includes buffer amplifier means driving said second amplifying means and adjusted to have an internal resistance of the magnitude needed to maintain said frequency of unity gain at a predetermined value.

4. The amplifier of claim 3 wherein said buffer comprises a differential transistor stage.

5. The amplifier of claim 4 wherein said differential transistor stage is supplied with a controlled tail current and one of the differential transistors is operated into a constant current load adjusted to have a value of one half of said tail current.

* * * * *